(12) United States Patent
Lundberg

(10) Patent No.: US 6,956,405 B2
(45) Date of Patent: Oct. 18, 2005

(54) TEACHER-PUPIL FLIP-FLOP

(75) Inventor: Jim Lundberg, Austin, TX (US)

(73) Assignee: IP-First, LLC, Fremont, CA (US)

( * ) Notice: Subject to any disclaimer, the term of this patent is extended or adjusted under 35 U.S.C. 154(b) by 12 days.

(21) Appl. No.: 10/616,473

(22) Filed: Jul. 9, 2003

(65) Prior Publication Data

US 2004/0032290 A1 Feb. 19, 2004

Related U.S. Application Data

(60) Provisional application No. 60/394,979, filed on Jul. 9, 2002.

(51) Int. Cl.[7] ............................................... H03K 3/037
(52) U.S. Cl. ........................... 326/95; 326/46; 327/199; 327/212
(58) Field of Search .............................. 326/93, 95, 98, 326/46; 327/199, 212, 218

(56) References Cited

U.S. PATENT DOCUMENTS

| | | | |
|---|---|---|---|
| 5,656,962 A | 8/1997 | Banik | |
| 6,097,230 A | 8/2000 | Bareither | |
| 6,566,927 B2 | 5/2003 | Park et al. | |
| 6,573,775 B2 | 6/2003 | Pilling | |
| 6,577,176 B1 * | 6/2003 | Masleid et al. | ............. 327/199 |

* cited by examiner

Primary Examiner—Daniel D. Chang
(74) Attorney, Agent, or Firm—Gary R. Stanford; Richard K. Huffman; James W. Huffman

(57) ABSTRACT

A teacher-pupil flip-flop with reduced register delay including a gate circuit, a stack circuit, a keeper circuit, a teacher output circuit, a latch circuit and a pupil output circuit. The gate circuit switches after a setup delay in response to transitions of a clock signal. The stack circuit, coupled to the gate circuit output and to an input, switches an intermediate node pair to a preliminary state when the clock signal is low, and to a data state indicative of the input after the setup delay when the clock signal goes high. The keeper circuit maintains the data state and the teacher output circuit drives the output based on the data state while the clock is high. The latch circuit stores the data state and the pupil output circuit drives the output with valid data from the latch circuit after the clock signal goes low.

20 Claims, 6 Drawing Sheets

TEACHER-PUPIL FLIP-FLOP

CROSS-REFERENCE TO RELATED APPLICATIONS

This application claims the benefit of U.S. Provisional Application No. 60/394,979, filed on Jul. 9, 2002, which is herein incorporated by reference in its entirety for all intents and purposes.

BACKGROUND OF THE INVENTION

1. Field of the Invention

The present invention relates to data flip-flops that may be used in data registers of pipeline stages, and more particularly to a teacher-pupil flip-flop that has a significantly decreased register delay time thereby increasing the amount of cycle time that is available to perform work during each cycle of a pipelined device.

2. Description of the Related Art

FIG. 1 is a block diagram illustrating the relationship between register delay and work intervals in a pipelined device 100 with successive stages separated by conventional D-type flip-flops 105, 106 and 107. A first stage 101 (STAGE N) including pipeline stage logic 102 is shown coupled to a second stage 103 (STAGE N+1) including pipeline stage logic 104. It is understood that additional stages may be included, such as prior stages before the stage 101 and later stages after stage 103. Data is passed from one stage to the next upon transition of a clock signal CLK. It is common practice within the art to transmit the output of one stage to the input of a following stage through a data register, where each data register includes one or more D-type flip-flops. Each D flip-flop handles one data bit and includes a clock input receiving the CLK signal.

As shown in FIG. 1, the first D flip-flop 105 receives a data signal X at its D input and provides a registered version of the X signal, or a data signal RX, at its Q output. The D flip-flop 105 may also include an inverted output, QB, in which it provides an inverted version of the RX signal, or signal RXB, at its QB output. A "B" appended to the signal or input/output (I/O) name denotes a complementary signal in which the complementary signal has an inverted or opposite logic state. The RXA and RXB signals are provided to the pipeline stage logic 102, which develops an output signal Y. The Y signal is provided to the D input of the second D flip-flop 106 located between the stages 101 and 103, where the D flip-flop 106 generates RY and RYB signals at its Q and QB outputs, respectively. The RY and RYB signals are processed by the pipeline stage logic 104, which develops an output signal Z provided to the D input of the third D flip-flop 107. The D flip-flop 107 generates RZ and RZB signals at its Q and QB outputs, respectively, and so on.

The state of a signal on the D input of the D flip-flop just prior to the clock transition is latched on the D flip-flop's Q and QB outputs just after the transition of the CLK signal. A finite amount of time, referred to as the REGISTER DELAY, elapses while the register passes the data from one stage to the next. As shown, each of the D flip-flops 105–107 incurs a REGISTER DELAY for conveying data between stages. The CLK signal determines the total amount of time available for each cycle. Each pipeline stage logic of the pipelined device 100, including the pipeline stage logic 102 and 104, performs functions during each cycle of the CLK signal. During the REGISTER DELAY time period, however, pipeline stage logic is not able to perform any functions. The time available to perform useful work during each cycle, referred to as the WORK INTERVAL, is equal to the overall cycle time of the CLK minus REGISTER DELAY. Hence, the pipelined device 100 is limited by the REGISTER DELAY that is required between cycles of the CLK signal.

FIG. 2 is a schematic diagram illustrating a conventional master-slave D flip-flop 200 according to prior art, representing any of the D flip-flops 105–107. The master-slave D flip-flop 200 features two substantially identical stages, including a master stage 201 followed by a slave stage 203. The master stage 201 includes a complementary pass gate 205 and a pair of inverters 207 and 209. The slave stage 203 also includes a complementary pass gate 211 and a pair of inverters 213 and 215. A P-channel device P1 and an N-channel device N1 form the complementary pass gate 205, in which the source of P1 is coupled to the drain of N1 and the source of N1 is coupled to the drain of P1. The D input is formed at the connection of the source of P1 and the drain of N1. The connection of the drain of P1 and the source of N1 is coupled to the input of the inverter 207 and to the output of the inverter 209. The output of the inverter 207 is coupled to the input of the inverter 209 and forms an input DI to the slave stage 203. The complementary pass gate 211 is formed by a P-channel device P2 and an N-channel device N2 coupled to each other in the same manner as P1 and N1, where the connection of the source of P2 and the drain of N2 forms the DI input. The connection of the source of N2 and the drain of P2 is coupled to the input of the inverter 213 and to the output of the inverter 215. The Q output of the master-slave D flip-flop 200 is formed at the output of the inverter 213, which is coupled to the input of the inverter 215.

Complementary opposite clock signals CLK and CLKB drive the successive stages of the D flip-flop 200. In particular, the CLK signal is provided to the gates of P1 and N2 and the CLKB signal is provided to the gates of P2 and N1. When CLK is low, the data on the D input is transmitted through the complementary pass gate 205 and the master inverter 207 and is setup to the DI input of the complementary pass gate 211 of the slave stage 203. The inverter 209 operates with inverter 207 as a keeper circuit to latch the data. When the CLK signal goes high, the complementary pass gate 205 closes and the complementary pass gate 211 opens, enabling the data to flow through the complementary pass gate 211 and the slave inverter 213 to the Q output. The inverter 215 operates with inverter 213 as a keeper circuit to latch the data at the Q output. The amount of time that elapses while the D input flows through the master stage 201 is called SETUP time and the amount of time required for the output of the master stage 201 to flow through the slave stage 203 to the output Q is called the CLOCK-TO-OUTPUT time. The sum of the SETUP and CLOCK TO-OUTPUT times is the REGISTER DELAY for the master-slave D flip-flop 200 when used as the D flip-flops 105–107 of the pipelined device 100.

FIG. 3 is a timing diagram illustrating the SETUP and CLOCK-TO-OUT times with respect to the CLK signal for the master-slave D flip-flop 200 of FIG. 2. The CLK signal and the states of the D input node and the Q output node are shown distributed along the vertical or Y-axis and plotted versus time along the horizontal or X-axis. As shown, successive data values DATA1 and DATA2 are asserted on the D input node. Prior to a rising edge 301 of CLK at time T1, the DATA1 value applied to the D input node must flow through the master stage 201 to the pass gate 211 of the slave stage 203. Thus, the minimum time that is required for the DATA1 value to flow through the master stage 201 is shown as the SETUP time between times T0 and T1. The DATA1 value must be valid at the D input prior to the beginning of the SETUP time at time T0. The pipeline stage logic in the previous stage must have completed its work and provided the DATA1 value to the D input prior to time T0 so that the required SETUP time of the master-slave D flip-flop 200 is met.

Similarly, following the rising clock edge 301, the DATA1 value flows through the slave stage 203 to Q output during the CLOCK-TO-OUTPUT time from time T1 to time T2, otherwise known as the output propagation time. The DATA1 value on Q output node is not valid until after the output propagation time has transpired, which is the amount of time required for the DATA1 value to flow through the complementary pass gate 211 and the inverter 213 of the slave stage 203. The pipeline stage logic in the following stage cannot begin work until after the output propagation time has elapsed to ensure processing valid data. At the present state of the art, for CLK cycle times roughly on the order of 0.5–1.0 nanoseconds (ns), the delay through a conventional register, such as employing the master-slave D flip-flop 200, is approximately 100 picoseconds (ps) which is evenly divided between the SETUP and CLOCK-TO-OUTPUT times.

It is clear from the discussion above with reference to FIGS. 1–3 that a reduction of the REGISTER DELAY enables logic within the pipeline stages to perform additional work. Alternatively, the overall speed of a pipelined device, including the pipelined device 100, is increased by decreasing the REGISTER DELAY between stages.

FIG. 4 is a schematic diagram of a master-slave flip-flop circuit 400, which is disclosed in U.S. Pat. No. 5,656,962, entitled "Master-Slave Flip-Flop Circuit with Bypass" to Banik. The master-slave flip-flop circuit 400 addressed the issue of REGISTER DELAY by providing a bypass stage 405 to significantly reduce the CLOCK-TO-OUTPUT time. The master-slave flip-flop circuit 400 is similar to the master-slave D flip-flop 200 and includes an identical master stage 401 followed by a slave stage 403. The slave stage 403 is similar to the slave stage 203, except it includes an additional inverter 407 followed by an additional complementary pass gate 409 inserted before the Q output node. The bypass stage 405 includes an inverter 411 having an input coupled to the intermediate junction between the complementary pass gate and inverter of the master stage 401 and an output coupled to one side of another complementary pass gate 413. The other side of the complementary pass gate 413 is coupled to the Q output node.

The bypass stage 405 essentially operates to bypass the slave stage 403 when the CLK signal goes high, thus exhibiting a CLOCK-TO-OUTPUT time equivalent to the delay through the pass gate 413 of the bypass stage 405. The slave stage 403 latches the data value applied to the D input node when the CLK signal is high and takes over driving the Q output when the CLK signal is low. The master-slave flip-flop circuit 400 has a SETUP time commensurate with the conventional master-slave flip-flop circuit 200 and has a reduced CLOCK-TO-OUTPUT time. With reference to FIG. 3, for example, the output data on the Q output node is valid relatively quickly after the rising edge 301 thereby reducing the overall REGISTER DELAY. The master-slave flip-flop circuit 400 may be useful for certain operations where CLOCK-TO-OUTPUT time is a critical factor.

Although the master-slave flip-flop circuit 400 has a reduced CLOCK-TO-OUTPUT time, this comes at the expense of valuable component real-estate and increased power consumption. Note, for example, that the master-slave flip-flop circuit 400 drives its output through the complementary pass gates 409 and 413. FIG. 5 is a schematic diagram of an exemplary output circuit 500 that may be employed by the master-slave flip-flop circuit 400. An INPUT signal is provided to the gates of complementary devices P and N coupled in series between a voltage source VDD and ground. The junction between the P and N devices is coupled to one side of a complementary pass gate 501, having its other side driving the OUTPUT signal. One of ordinary skill in the art will appreciate that the drive strength of a device is linearly proportional to device width and inverse linearly proportional to device length. Driving an output through a pass gate effectively doubles the length of the output device. Hence, to drive a load equivalent to that of a conventional D flip-flop, such as the master-slave flip-flop circuit 400, the inverters 407 and 411 of the master-slave flip-flop circuit 400 must be doubled in width, resulting in a four-fold increase in size of each output inverter. Also, the master-slave flip-flop circuit 400 has two output inverters, substantially increasing overall size of each flip-flop of each register between each stage of the pipelined device 100. Practical implementations of the master-slave flip-flop circuit 400 are costly in terms of size and power consumption.

It is desired to provide a register device with reduced register delay without significant increase in expense in terms of real-estate and power.

SUMMARY OF THE INVENTION

A teacher-pupil flip-flop according to an embodiment of the present invention includes a teacher circuit and a pupil circuit. The teacher circuit includes a gate circuit, a stack circuit, a keeper circuit and a teacher output circuit. The pupil circuit includes a latch circuit and a pupil output circuit. The gate circuit has an output and a plurality of inputs coupled to an intermediate node pair and receives a clock signal. The gate circuit switches after a setup delay in response to transitions of the clock signal between first and second states. The stack circuit is coupled to the gate circuit output and to an input data node. The intermediate node pair is switched to a preliminary state after the setup delay when the clock signal transitions to the first state, and is switched to a data state indicative of the input data node after the setup delay when the clock signal transitions to the second state. The keeper circuit is coupled to the intermediate node pair. The teacher output circuit drives an output node indicative of the data state of the intermediate node pair. The latch circuit stores the data state of the intermediate node pair. The pupil output circuit drives the output node indicative of the data state after the clock signal transitions to the first state.

In one embodiment, the intermediate node pair includes a pull-up node and a pull-down node and the stack circuit includes a first stack circuit coupled to the pull-down node and a second stack circuit coupled to the pull-up node. The first stack circuit drives the pull-down node low during the preliminary state, and drives the pull-down node high during the data state if the input data node is low upon expiration of the setup time delay. The second stack circuit drives the pull-up node high during the preliminary state, and drives the pull-up node low during the data state if the input data node is high upon expiration of the setup time delay. In exemplary embodiments, existing state of the art devices may be used. For example, the gate circuit may include a NAND gate and a NOR gate. The remaining portions may be implemented with standard-sized inverters and complementary devices, such as N-channel devices and P-channel devices.

A register according to an embodiment of the present invention includes first and second gates, first and second stack circuits, first and second keeper circuits, first and second output circuits and a storage circuit. The first gate has a first input receiving a clock signal, a second input coupled to a pull-up node and an output. The second gate has a first input receiving an inverted clock signal, a second input coupled to a pull-down node and an output. The first stack circuit has a first input coupled to the first gate output, a second input coupled to a data input and an output coupled to the pull-down node. The second stack circuit has a first input coupled to the second gate output, a second input coupled to the data input and an output coupled to the pull-up node. The first keeper circuit is coupled to the pull-down node and the second keeper circuit is coupled to the pull-up node. The first output circuit includes complementary devices which have inputs coupled to the pull-down and pull-up nodes and outputs coupled to an output node. The storage circuit has a first input coupled to the pull-down node, a second input coupled to the pull-up node, and at least one storage node. The second output circuit receives the clock and inverted clock signals, has an input coupled to the storage node of the storage circuit, and has complementary output devices coupled to the output node.

A register according to an alternative embodiment of the present invention includes a gate circuit, a stack circuit, a keeper circuit, an output circuit and a pupil circuit. The gate circuit has first and second outputs switched in response to a plurality of inputs after a delay. The stack circuit has first and second inputs coupled to the outputs of the gate circuit, a third input coupled to a data input, and first and second outputs coupled to first and second intermediate nodes. The gate and stack circuits are operative to toggle the intermediate nodes between an initial state when the clock signal transitions low after the delay and a data state indicative of the data input when the clock signal transitions high after the delay. The keeper circuit latches the data state of the intermediate nodes. The output circuit drives an output node with valid data while the intermediate nodes are in the data state. The pupil circuit stores the data state of the intermediate nodes and drives the output node with valid data while the clock signal is low.

Registers implemented with teacher-pupil flip-flops according to embodiments of the present invention exhibit reduced register delay. The clock-to-output time, which is the collective delay through the input gate circuit, the stack circuit and the teacher output circuit, is comparable to a conventional register. The setup time, however, is negative since the data value applied to the input may vary during the setup delay through the gate circuit. The resultant register delay is only the delay through the stack and output circuits during each clock cycle. The register delay is substantially reduced even if the clock-to-output time is longer due to the negative setup time. Standard-sized devices may be used thereby avoiding additional cost in terms of real-estate consumption and power.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventor of the present application has recognized the need for significantly reducing delay and maximizing the useful work interval during each cycle of a pipelined device. The inventor has further recognized the need to increase the amount of cycle time that is available to perform work without the expense of real-estate and power. He has therefore developed a teacher-pupil flip-flop circuit that may be employed within the registers of a pipelined device that maximizes the useful work interval during each clock cycle and that can be fabricated using conventional-sized devices to avoid additional expense, as will be further described below with respect to FIGS. 6–8.

Figure 1:
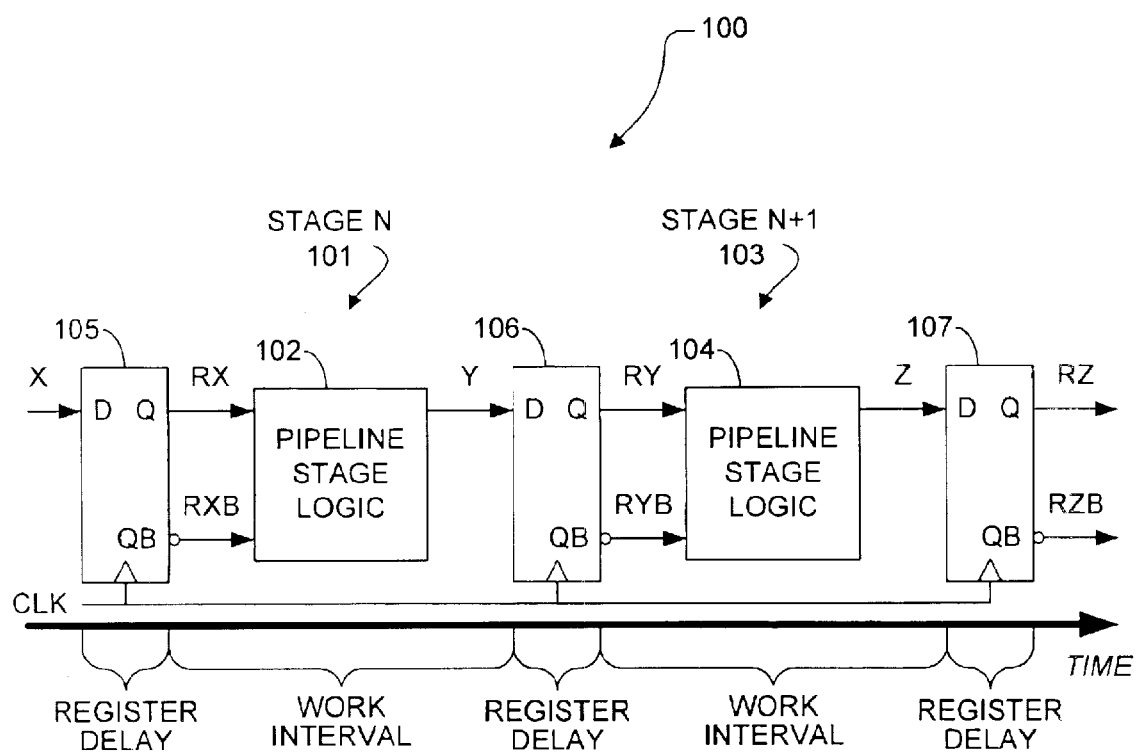
FIG. 1 is a block diagram illustrating the relationship between register delay and work intervals in a pipelined device with successive stages separated by conventional D-type flip-flops.
Figure 2:
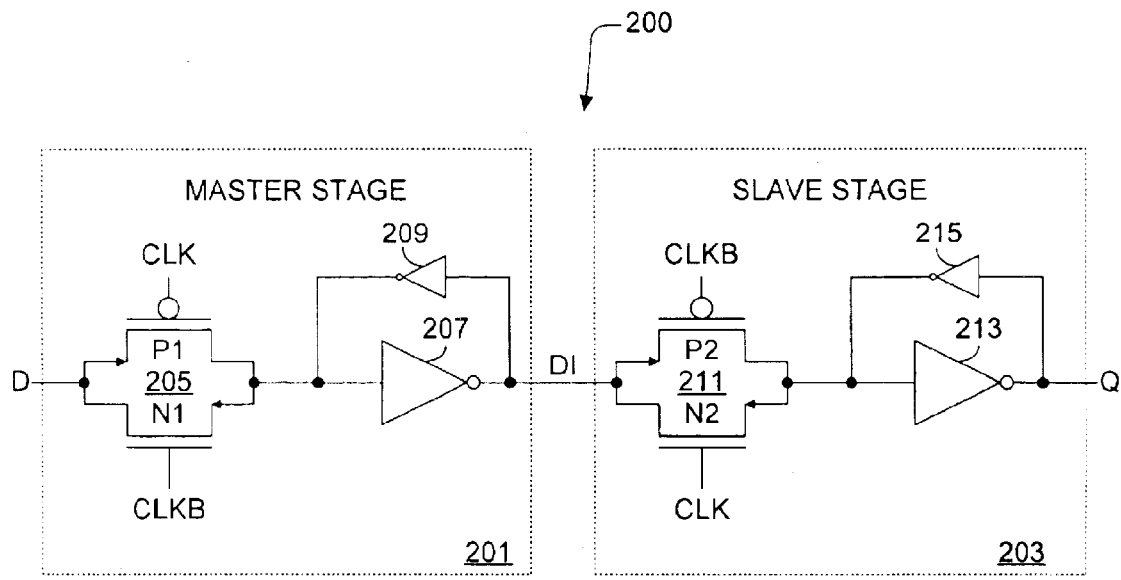
FIG. 2 is a schematic diagram illustrating a conventional master-slave D flip-flop according to prior art, representing any of the D flip-flops of FIG. 1.
Figure 3:
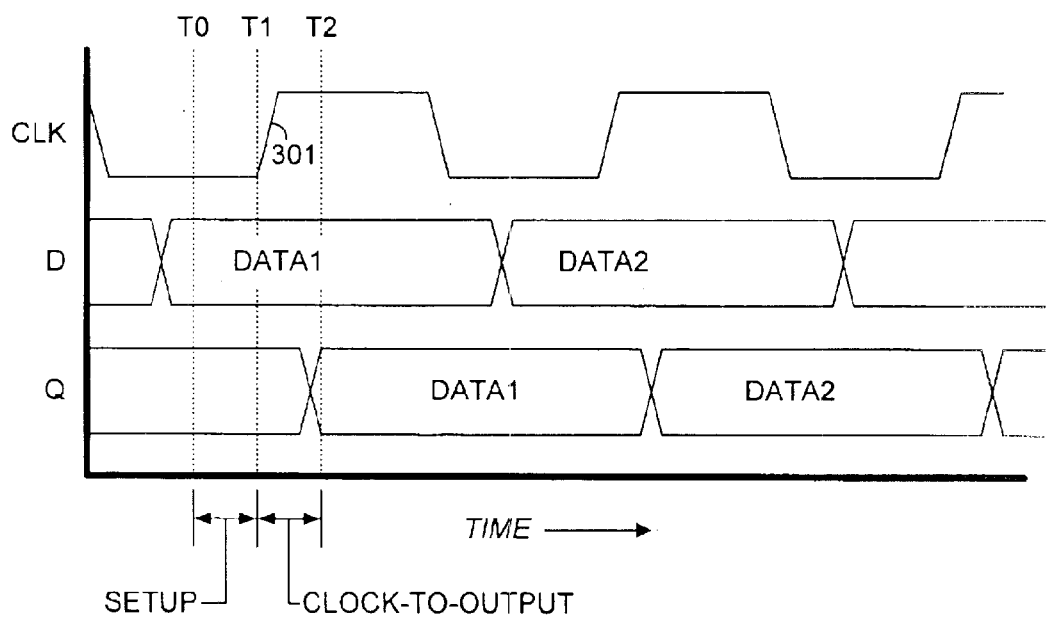
FIG. 3 is a timing diagram illustrating the SETUP and CLOCK-TO-OUT times with respect to the CLK signal for the master-slave D flip-flop of FIG. 2.
Figure 4:
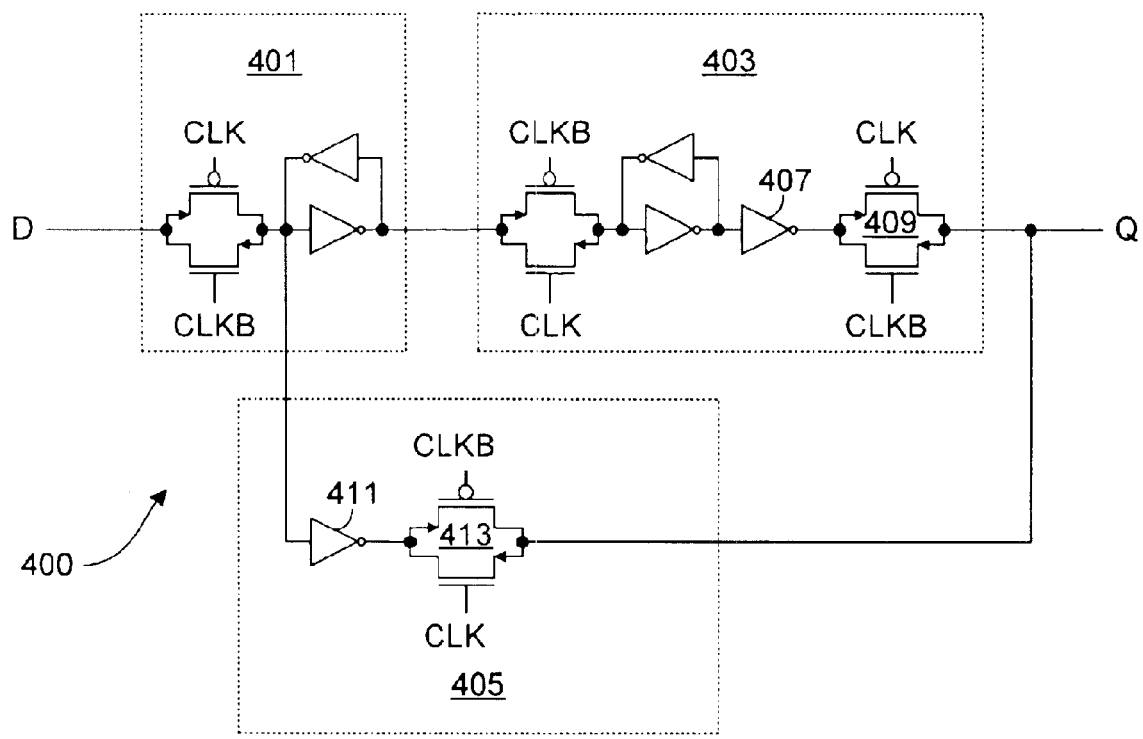
FIG. 4 is a schematic diagram of a master-slave flip-flop circuit which exhibits improved register delay time but which comes at the expense of real-estate and power.
Figure 5:
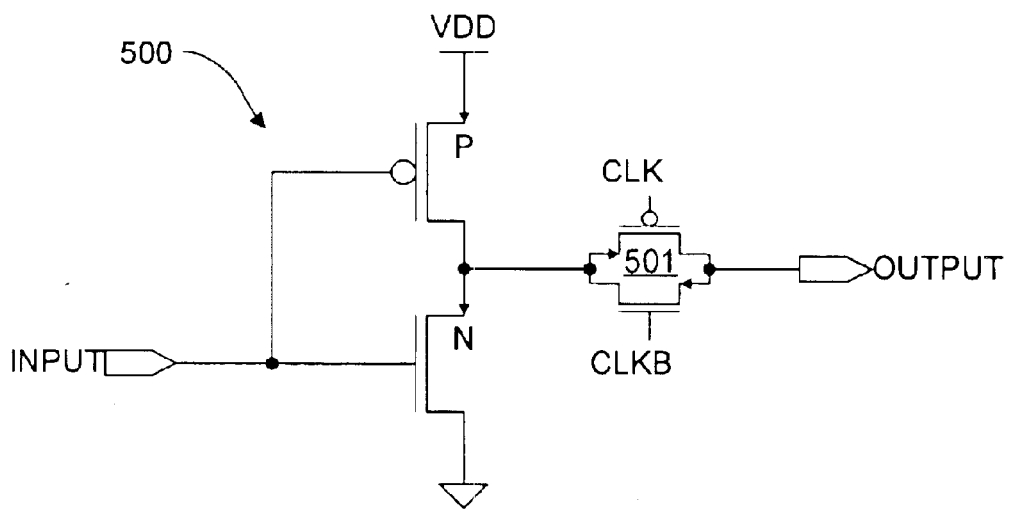
FIG. 5 is a schematic diagram of an exemplary output circuit that is employed by the master-slave flip-flop circuit of FIG. 4.
Figure 6:
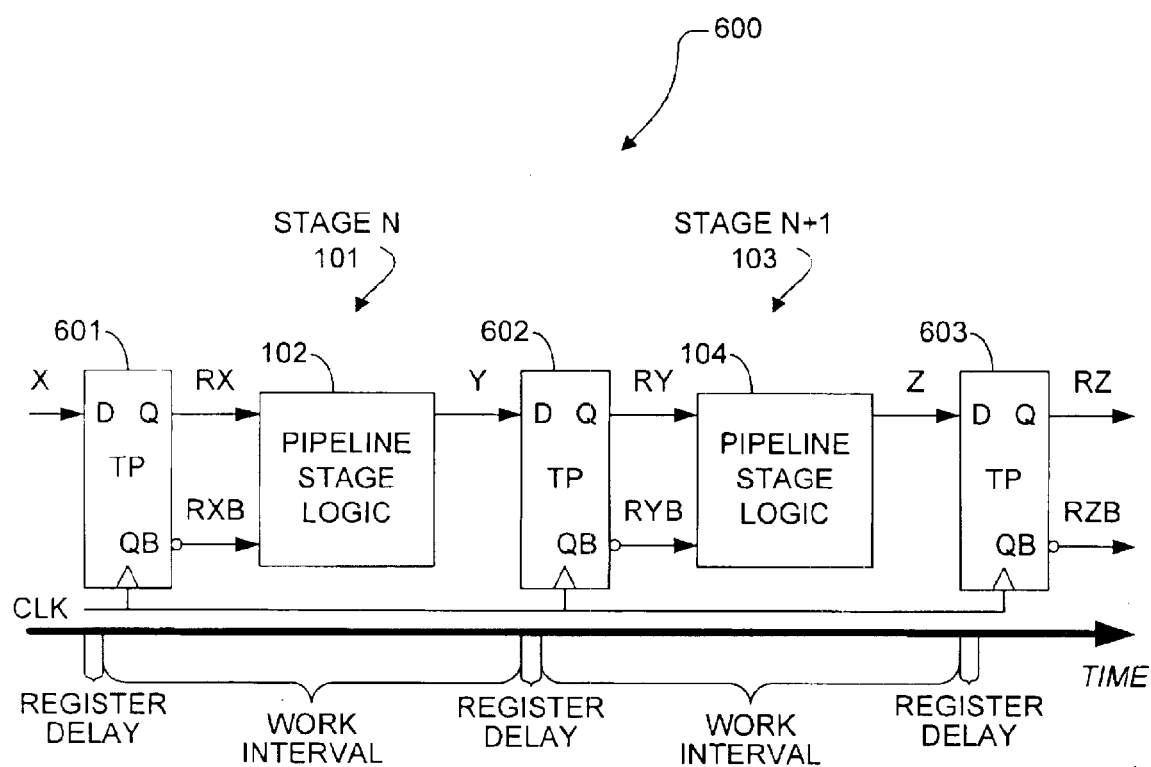
FIG. 6 is a block diagram illustrating the relationship between register delay and work intervals in a pipelined device with successive stages separated by teacher-pupil flip-flops implemented according to an exemplary embodiment of the present invention.

FIG. 6 is a block diagram illustrating the relationship between register delay and work intervals in a pipelined device 600 with successive stages separated by teacher-pupil flip-flops 601, 602 and 603 implemented according to an exemplary embodiment of the present invention. The pipelined device 600 is similar to the pipelined device 100, where similar devices assume identical reference numerals, except that the conventional D-type flip-flops 105, 106 and 107 are replaced by the teacher-pupil flip-flops 601, 602 and 603, respectively. As described more fully below, the REGISTER DELAY of the teacher-pupil flip-flops 601, 602 and 603 is substantially reduced as compared to the REGISTER DELAY of the conventional D-type flip-flops 105, 106 and 107, so that the work interval for each of the stages is substantially increased.

Figure 7:
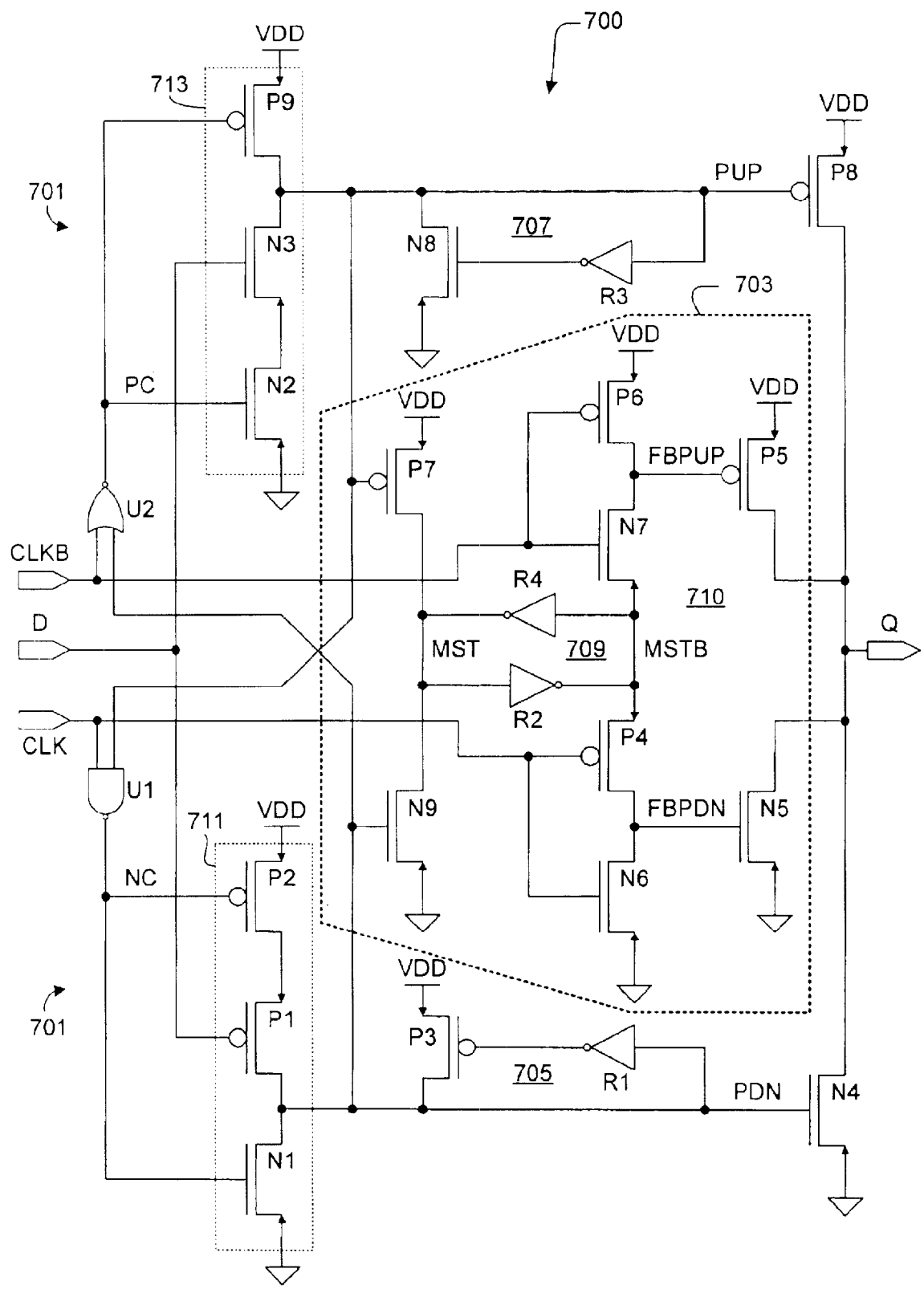
FIG. 7 is a schematic diagram of a teacher-pupil flip-flop according to an exemplary embodiment of the present invention that may be used as any of the teacher-pupil flip-flops of FIG. 6.

FIG. 7 is a schematic diagram of a teacher-pupil flip-flop 700 according to an exemplary embodiment of the present invention that may be used as any of the teacher-pupil flip-flops 601, 602 and 603. The teacher-pupil flip-flop 700 is a register having a CLOCK-TO-OUTPUT time that is commensurate or slightly greater than a conventional register, such as the master-slave flip-flop 200, but with a SETUP time that is negative (i.e., less than zero). A SETUP time that is negative means that the input data value can still change after the operative transition of the CLK signal, while the CLK signal edge is still propagating through input devices. Thus, the input data value does not have to be valid until a significant amount of time after the CLK transition (e.g., rising CLK edge). In this manner, the REGISTER DELAY is significantly reduced as compared to the master-slave flip-flops 200 and 400. In addition, the teacher-pupil flip-flop 700 does not drive its Q output through pass gates, but instead uses standard-sized output devices. In this manner, the teacher-pupil flip-flop 700 may be implemented without the increased cost in size and power consumption.

The teacher-pupil flip-flop 700 includes a teacher portion 701 and a pupil portion 703. The teacher portion 701 includes a 2-input NAND gate U1, in which one input receives the CLK signal and the other input is coupled to a pull-up node PUP. The output of the NAND gate U1 is coupled to a node NC. A 2-input NOR gate U2 receives the CLKB signal at one input, has its other input coupled to a pull-down node PDN, an its output coupled to a node PC. The NC node is coupled to the gates of a P-channel device P1 and an N-channel device N1. The PC node is coupled to the gates of a P-channel device P9 and an N-channel device N2. The D input node is coupled to the gates of an N-channel device N3 and a P-channel device P1. P9 has its source coupled to VDD and its drain coupled to the drain of N3 at the PUP node. The source of N3 is coupled to the drain of N2, which has its source coupled to ground. P2 has its source coupled to VDD and its drain coupled to the source of P1. The drain of P1 is coupled to the drain of N1 at the PDN node, and the source of N1 is coupled to ground. The devices P1, P2 and N1 form a first stack circuit 711 and the devices P9, N3 and N2 form a second stack circuit 713.

The PUP node is coupled to the gate of an output P-channel device P8, having its source coupled to VDD and its drain coupled to the Q output node. The PDN node is coupled to the gate of an output N-channel device N4, having its source coupled to ground and its drain coupled to the Q output node. The teacher portion 701 includes a first keeper circuit 705 coupled to the PDN node and a second keeper circuit 707 coupled to the PUP node. The keeper circuit 705 includes an inverter R1 and a P-channel device P3. The input of the inverter R1 is coupled to the PDN node and its output is coupled to the gate of P3, which has its source coupled to VDD and its drain coupled to the PDN node. The keeper circuit 707 includes an inverter R3 and an N-channel device N8. The input of the inverter R3 is coupled to the PUP node and its output is coupled to the gate of N8, which has its source coupled to ground and its drain coupled to the PUP node.

In the pupil portion 703, the PUP node is coupled to the gate of a P-channel pass device P7 and the PDN node is coupled to the gate of an N-channel pass device N9. P7 has its source coupled to VDD and its drain coupled to the drain of N9 at a data storage node MST. The source of N9 is coupled to ground. The MST node is coupled to the input of an inverter R2 and to the output of another inverter R4, which has its input coupled to the output of inverter R2. The output of R2 and the input of R4 form a inverted data storage node MSTB, which stores a complement of the data value stored at the MST node. The pass devices P7 and P9 and the inverters R2 and R4 form a storage circuit or latch circuit 709 for latching and temporarily storing the data state of the PUP and PDN nodes, as further described below. The stored data state is indicative of the data value applied to the D input node during the rising edge of the CLK signal.

The CLKB signal is provided to the gates of a P-channel device P6 and an N-channel device N7 and the CLK signal is provided to the gates of a P-channel device P4 and an N-channel device N6. The source of P6 is coupled to VDD and the drain of P6 is coupled to the drain of N7 at a feedback pull-up node FBPUP. The sources of N7 and P4 are coupled together at the MSTB node. The drain of P4 is coupled to the drain of N6 at a feedback pull-down node FBPDN. The source of N6 is coupled to ground. The FBPUP node is coupled to the gate of a P-channel output device P5, which has its source coupled to VDD and its drain coupled to the Q output node. The FBPDN node is coupled to the gate of an N-channel output device N5, which has its source coupled to ground and its drain coupled to the Q output node. The devices P4–P6 and N5–N7 collectively from a pupil output circuit 710, which drives the Q output node according to a data value stored by the latch circuit 709 after CLK signal transitions low.

The NC/PC nodes collectively form a preliminary node pair switched by the input gates U1 and U2. The delay through the input gates U1/U2 establishes a SETUP time for valid data provided to the D input node. The PDN/PUP nodes collectively form an intermediate node pair. The input gates U1 and U2 are switched based on transitions of the complementary clock signal pair CLK/CLKB and the state of the intermediate node pair. The intermediate node pair is switched the stack circuits 711 and 713. When CLK is low and CLKB is high, the preliminary node pair is driven to an initial state turning on devices P9 and N1, which drives the intermediate node pair to a preliminary state in which PUP is high and PDN is low. When the CLK signal transitions high (and the CLKB signal transitions low), the intermediate node pair is switched to a data state indicative of the state of the data value applied to the D input node after expiration of the SETUP delay through the gates U1 and U2 and any delay through the stack circuits 711 and 713. In particular, upon expiration of the SETUP delay, the PDN/PUP nodes are both driven high if the D input node is low or are both driven low if the D input node is high. One of the output devices N4 or P8 is turned on to drive the Q output node with valid data during the remainder of the CLK half cycle. The keeper circuits 705 and 707 maintain the data state of the intermediate node pair, which is transferred to the MST/MSTB nodes via one of the pass devices N9 or P7.

When the CLK signal transitions low again, the MSTB node is applied to the FBPUP and FBPDN nodes via the P4 and N7 devices, so that one of the pupil output devices N5 or P5 drives the Q output node with valid data after delay through P4/N7 and N5/P5. Upon expiration of the collectively delay through the input gates U1 and U2 and the stack circuits 711 and 713 after the CLK signal goes low, the intermediate node pair is returned to the preliminary state and the output devices N4 and P8 are tri-stated.

Figure 8:
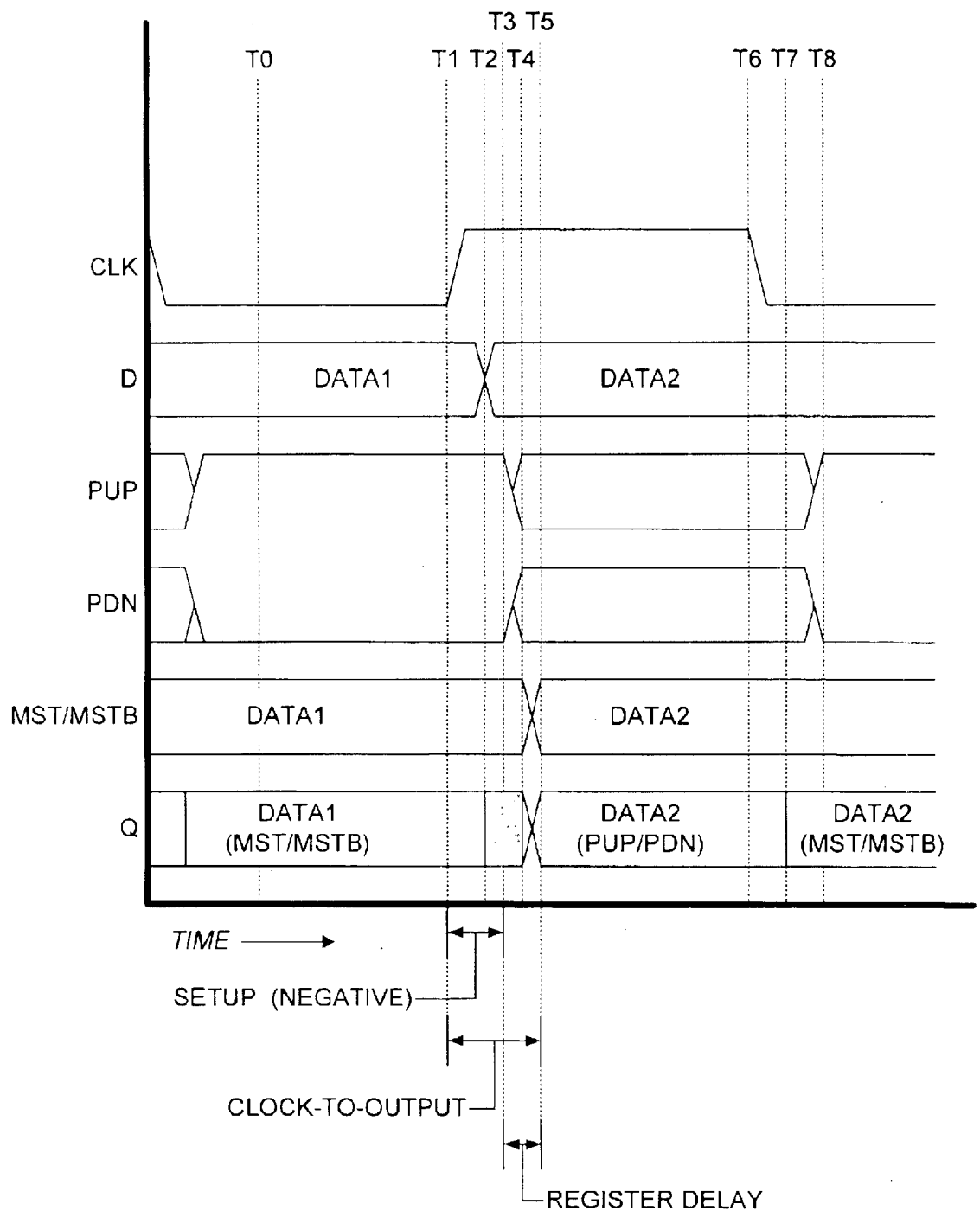
FIG. 8 is a timing diagram illustrating the SETUP and CLOCK-TO-OUT times with respect to the CLK signal for the teacher-pupil flip-flop of FIG. 7.

FIG. 8 is a timing diagram illustrating the SETUP and CLOCK-TO-OUT times with respect to the CLK signal for the teacher-pupil flip-flop 700 of FIG. 7. The CLK signal and the D, PUP, PDN, MST/MSTB, and Q nodes are distributed along the Y-axis and plotted versus time along the X-axis. When the CLK signal is low at time T0, the NAND gate U1 drives the NC node high and the NOR gate U2 drives the PC node low. The NC node pulled high turns on the device N1, which pulls the PDN node low tri-stating the output device N4. The PC node pulled low turns on the device P9, which pulls the PUP node high tri-stating the output device P8. Thus, during CLK low, N1 holds N4 off and P9 holds P8 off. Also, the CLK and CLKB signals turn on devices P4 and N7, respectively, of the pupil output circuit 710, so that the MSTB node is provided to the gates of the output devices N5 and P5 via the FBPUP and PBPDN nodes, respectively. The state of the MST and MSTB nodes are latched complementary versions of the data value applied to the D input node during the immediately preceding rising edge of the CLK signal, referred to as a value DATA1. Thus, if the DATA1 value is low (i.e., if the D input node was low during the immediately preceding rising edge of the CLK signal), then the MST node is latched low and the MSTB node is latched high (via latch circuit 709), and the output device P5 is tri-stated while the output device N5 is turned on. The Q output node is pulled low via N5. Likewise, if the DATA1 value is high, then the output device N5 is tri-stated while the output device P5 is turned on, which pulls the Q output node high via P5. As shown in the timing diagram, the Q output node at time T0 is a version of the DATA1 value determined by the latched MST/MSTB nodes.

When CLK rises at following time T1, the pupil devices P4 and N7 are turned off and the pupil devices N6 and P6 are turned on, which turns off (tri-states) the pupil output devices N5 and P5 at time T2 (after delay through P6/N6 and P5/N5). Beginning at time T2, the Q output node is shown shaded since the output devices P8/N4 and P5/N5 are all tri-stated, during this period. The CLK and CLKB signals propagate through the NAND gate U1 and the NOR gate U2 by time T3, at which time the next data value, shown as the DATA2 value, must be valid. The teacher devices P2 and N2 are turned on and the devices N1 and P9 are turned off by the NC and PC nodes, respectively, from time T3 to following time T4. As shown, the DATA2 value is asserted on the D input node and is valid by time T3. If the DATA2 value is low, it turns P1 on and N3 off, and a high level is propagated on the PDN node by time T4 to turn on N4 and pull the Q output node low by following time T5. If the DATA2 value is high, it turns N3 on and P1 off, and a low level is propagated on the PUP node by time T4 to turn on P8 and pull the Q output node high by time T5. Thus, by time T5, the Q output node is driven to the same state as the DATA2 value asserted on the D input node at time T3.

While the CLK signal is high, if the DATA2 value is low, the high level on the PDN node is fed back to the input of the NOR gate U2, which pulls the PC node low causing P9 to turn on and N2 to turn off. P9 keeps the PUP node high, which keeps P8 off. The high level on the PUP node is fed back to the NAND gate U1, which keeps the NC node low thus locking P2 on and N1 off. In a similar manner, if the DATA2 value is high, the low level on the PUP node is fed back to the input of the NAND gate U1, which pulls the NC node high causing N1 to turn on and P2 to turn off. N1 keeps the PDN node low, which keeps N4 off. The low level on the PDN node is fed back to the NOR gate U2, which keeps the PC node high thus locking N2 on and P9 off. In either case, the keeper circuits 705 and 707 latch the state of the PDN and PUP signals, respectively, during the remainder of the high half-cycle of the CLK signal in case the DATA signal changes.

The PUP and PDN nodes are both latched low if the DATA2 value is high at time T3, or are both latched high if the DATA2 value is low at time T3. The data state of this intermediate node pair is transferred to the MST signal via either of the pass devices P7 or N9 during approximately the same time the state is transferred to the Q output node from time T4 to time T5. If the PDN/PUP nodes are high, then the pass device N9 is turned on pulling the MST node low. Similarly, if the PDN/PUP nodes are low, then the pass device P7 is turned on pulling the MST node high. The latch circuit 709 maintains the state of the MST and MSTB nodes during the remainder of the high half-cycle of the CLK signal. The CLK signal goes low at time T6, turning on devices P4 and N7. The MSTB node is transferred to the FBPUP and FBPDN nodes as previously described, and the latched state of the DATA2 value via the MSTB node is asserted to the Q output node at following time T7 after the delay through devices P4/N7 and P5/N5. The state of the Q output node does not change but is now driven by one of the output devices P5 or N5 based on the latched state of MST/MSTB. At time T8 after the delay through the gates U1/U2 and the devices N1/P9, the PUP and PDN nodes are pulled back to the preliminary state, thus tri-stating the output devices P8 and N4.

It is appreciated that the data value asserted on the D input node is propagated through the devices P1/N3 and N4/P8 to the Q output node very soon after the SETUP time in which the CLK signal transition propagates through the input gates U1 and U2. The CLOCK-TO-OUTPUT time from time T1 to time T5 is equivalent to the delay through the gates U1 and U2, plus the delay through either the first stack circuit 711 or the second stack circuit 713, plus the delay through the teacher output devices N4 or P8. This total delay is slightly longer than a conventional register (e.g., a conventional register employing the master-slave D flip-flop 200). The SETUP time, however, is negative. A negative SETUP time means that the data value at the D input node is allowed to vary after the rising CLK edge and during the SETUP time while the rising edge propagates through the gates U1 and U2, which is from time T1 to time T3. In one embodiment according to the present state of the art, the delay from T1 to T3 is approximately 100 ps. In this manner, the input data value (e.g., DATA2) does not have to be valid until time T3, which is after the CLK signal clock goes high. After the slight delay of the N1/P2 and N2/P9 devices, the state of the input data value is latched by the keeper circuits 705 and 707, and then propagated to the Q output node via the output devices N4/P8.

Since the SETUP time is negative, the resulting REGISTER DELAY is the CLOCK-TO-OUTPUT time minus the SETUP time (or plus a negative SETUP time), shown as the time T3 to T5, which is very fast compared to the REGISTER DELAY of a conventional register. Since the REGISTER DELAY is very short, the useful work interval during each clock cycle of a pipelined device employing the teacher-pupil flip-flop 700 is substantially increased thereby maximizing the amount of total work performed. The speed of the pipelined device, or any device employing a teacher-pupil flip-flop in accordance with embodiments of the present invention, can be significantly increased. Furthermore, a teacher-pupil flip-flop in accordance with embodiments of the present invention can be fabricated using conventional device sizes for output drivers. An additional advantage of the teacher-pupil flip-flop 700 is that the Q output node asserts from tri-state, which provides a speed improvement over that provided by conventional circuits that employ a, ratioed transition on their outputs.

The delay through the input gates U1 and U2 is shown as longer than the delay through the N7/P5 or P4/N5 devices (e.g., T3 occurs after time T2). The delay through these gates, however, may be shorter so that time T3 is closer in time to or possibly even before time T2. The analysis is substantially the same as long as the data value on the D input node is valid by time T3. The resultant REGISTER DELAY is not changed since the magnitudes of the CLOCK-TO-OUTPUT and SETUP times are changed by the same amount.

Although the present invention has been described in considerable detail with reference to certain preferred versions thereof, other versions and variations are possible and contemplated. For example, the polarities of various devices may be reversed and specific timing values may vary depending upon the state of the art. Moreover, although the present disclosure contemplates application to metal-oxide semiconductor (MOS) type devices, including complementary MOS devices and the like, such as, for example, NMOS and PMOS transistors, it may also be applied in a similar manner to analogous types of technologies and topologies, such as bipolar devices and the like.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

What is claimed is:

1. A teacher-pupil flip-flop, comprising:
    a teacher circuit, comprising:
        a gate circuit, having an output and having a plurality of inputs coupled to an intermediate node pair and receiving a clock signal, that switches after a setup delay in response to transitions of said clock signal between first and second states;
        a stack circuit, coupled to said gate circuit output and to an input data node, that switches said intermediate node pair to a preliminary state after said setup delay when said clock signal transitions to said first state, and that switches said intermediate node pair to a data state indicative of said input data node after said setup delay when said clock signal transitions to said second state;
        a keeper circuit coupled to said intermediate node pair; and
        a teacher output circuit, coupled to said intermediate node pair, that drives an output node indicative of said data state; and
    a pupil circuit, comprising:
        a latch circuit, coupled to said intermediate node pair, that stores said data state of said intermediate node pair; and
        a pupil output circuit, coupled to said latch circuit and receiving said clock signal, that drives said output node indicative of said data state after said clock signal transitions to said first state.

2. The teacher-pupil flip-flop of claim 1, further comprising:
    said intermediate node pair including a pull-up node and a pull-down node; and
    said stack circuit comprising:
        a first stack circuit that drives said pull-down node low during said preliminary state, and that drives said pull-down node high during said data state if said input data node is low upon expiration of said setup time delay; and
        a second stack circuit that drives said pull-up node high during said preliminary state, and that drives said pull-up node low during said data state if said input data node is high upon expiration of said setup time delay.

3. The teacher-pupil flip-flop of claim 2, wherein said teacher output circuit comprises:
    an output P-channel device having a source coupled to a voltage supply, a gate coupled to said pull-up node and a drain coupled to said output node; and
    an output N-channel device having a source coupled to ground, a gate coupled to said pull-down node and a drain coupled to said output node.

4. The teacher-pupil flip-flop of claim 3, wherein said output P-channel device tri-states its drain while said pull-up node is high, and wherein said output N-channel device tri-states its drain while said pull-down node is low.

5. The teacher-pupil flip-flop of claim 2, wherein said gate circuit comprises:
    a NAND gate having a first input receiving said clock signal, a second input coupled to said pull-up node and an output coupled to said stack circuit; and
    a NOR gate having a first input receiving an inverted clock signal, a second input coupled to said pull-down node and an output coupled to said stack circuit.

6. The teacher-pupil flip-flop of claim 5, wherein:
    said first stack circuit comprises:
        a first stack P-channel device having a source coupled to a voltage supply, a gate coupled to said output of said NAND gate and a drain;
        a second stack P-channel device having a source coupled to said drain of said first stack P-channel device, a gate coupled to said data input node and a drain coupled to said pull-down node; and
        a first stack N-channel device having a drain coupled to said pull-down node, a gate coupled to said output of said NAND gate and a source coupled to ground; and
    wherein said second stack circuit comprises:
        a third stack P-channel device having a source coupled to said voltage supply, a gate coupled to said output of said NOR gate and a drain coupled to said pull-up node;
        a second stack N-channel device having a drain coupled to said pull-up node, a gate coupled to said data input node and a source; and
        a third stack N-channel device having a drain coupled to said source of said second stack N-channel device, a gate coupled to said output of said NOR gate and a source coupled to ground.

7. The teacher-pupil flip-flop of claim 2, wherein said keeper circuit comprises:
    a pull-up keeper circuit, comprising:
        a first inverter having an input coupled to said pull-up node of said intermediate node pair and an output; and
        a pull-up N-channel device having a drain coupled to said pull-up node, a gate coupled to said output of said first inverter and a source coupled to ground; and
    a pull-down keeper circuit, comprising:
        a second inverter having an input coupled to said pull-down node of said intermediate node pair and an output; and
        a pull-down P-channel device having a source coupled to a voltage source, a gate coupled to said output of said second inverter and a drain coupled to said pull-down node.

8. The teacher-pupil flip-flop of claim 2, wherein said latch circuit comprises:
    a pass P-channel device having a source coupled to a voltage source, a gate coupled to said pull-up node and a drain coupled to a data storage node;
    a pass N-channel device having a drain coupled to said data storage node, a gate coupled to said pull-down node and a source coupled to ground;
    a first inverter having an input coupled to said data storage node and an output coupled to an inverted data storage node; and a second inverter having an input coupled to said inverted data storage node and an output coupled to said data storage node.

9. The teacher-pupil flip-flop of claim 8, wherein said pupil output circuit comprises:
   a first P-channel device having a source coupled to said voltage source, a gate receiving an inverted clock signal and a source coupled to a feedback pull-up node;
   a first N-channel device having a drain coupled to said feedback pull-up node, a gate receiving said inverted clock signal and a source coupled to said inverted data storage node;
   a second P-channel device having a source coupled to said inverted data storage node, a gate receiving said clock signal and a drain coupled to a feedback pull-down node;
   a second N-channel device having a drain coupled to said feedback pull-down node, a gate receiving said clock signal and a source coupled to ground;
   an output P-channel device having a source coupled to said voltage source, a gate coupled to said feedback pull-up node and a drain coupled to said output node; and
   an output N-channel device having a source coupled to ground, a gate coupled to said feedback pull-down node and a drain coupled to said output node.

10. The teacher-pupil flip-flop of claim 9, wherein said output P-channel device tri-states its drain while said feedback pull-up node is high, and wherein said output N-channel device tri-states its drain while said feedback pull-down node is low.

11. A register, comprising:
   a first gate having a first input receiving a clock signal, a second input coupled to a pull-up node and an output;
   a second gate having a first input receiving an inverted clock signal, a second input coupled to a pull-down node and an output;
   a first stack circuit having a first input coupled to said first gate output, a second input coupled to a data input and an output coupled to said pull-down node;
   a second stack circuit having a first input coupled to said second gate output, a second input coupled to said data input and an output coupled to said pull-up node;
   a first keeper circuit coupled to said pull-down node;
   a second keeper circuit coupled to said pull-up node;
   a first output circuit comprising complementary devices having inputs coupled to said pull-down and pull-up nodes and outputs coupled to an output node;
   a storage circuit having a first input coupled to said pull-down node, a second input coupled to said pull-up node, and at least one storage node; and
   a second output circuit, receiving said clock and inverted clock signals, having an input coupled to said at least one storage node of said storage circuit, and having complementary output devices coupled to said output node.

12. The register of claim 11, wherein said first gate is a NAND gate and wherein said second gate is a NOR gate.

13. The register of claim 11, wherein:
   said first stack circuit comprises:
      a first P-channel device having a source coupled to a voltage supply, a gate coupled to said first gate output and a drain;
      a second P-channel device having a source coupled to said drain of said first P-channel device, a gate coupled to said data input and a drain coupled to said pull-down node; and
      a first N-channel device having a drain coupled to said pull-down node, a gate coupled to said first gate output and a source coupled to ground; and
   wherein said second stack circuit comprises:
      a third P-channel device having a source coupled to said voltage supply, a gate coupled to said second gate output and a drain coupled to said pull-up node;
      a second N-channel device having a drain coupled to said pull-up node, a gate coupled to said data input and a source; and
      a third N-channel device having a drain coupled to said source of said second N-channel device, a gate coupled to said second gate output and a source coupled to ground.

14. The register of claim 11, wherein said first output circuit comprises:
   a P-channel device having a source coupled to a voltage source, a gate coupled to said pull-up node and a drain coupled to said output node; and
   an N-channel device having a source coupled to ground, a gate coupled to said pull-down node and a drain coupled to said output node.

15. The register of claim 11, wherein said storage circuit comprises:
   a P-channel pass device having a source coupled to a voltage source, a gate coupled to said pull-up node and a drain coupled to a storage node;
   an N-channel pass device having a source coupled to ground, a gate coupled to said pull-down node and a drain coupled to said storage node;
   a first inverter having an input coupled to said storage node and an output coupled to an inverted storage node; and
   a second inverter having an input coupled to said inverted storage node and an output coupled to said storage node.

16. The register of claim 11, wherein said second output circuit comprises:
   a first P-channel device having a source coupled to a voltage source, a gate receiving said inverted clock signal and a drain;
   a first N-channel device having a drain coupled to said drain of said first P-channel device, a gate receiving said inverted clock signal and a source coupled to said at least one storage node of said storage circuit;
   a second P-channel device having a source coupled to said at least one storage node of said storage circuit, a gate receiving said clock signal and a drain;
   a second N-channel device having a source coupled to ground, a gate receiving said clock signal and a drain coupled to said drain of said second P-channel device;
   a third P-channel device having a source coupled to said voltage source, a gate coupled to said drain of said first P-channel device and a drain coupled to said output node; and
   a third N-channel device having a source coupled to ground, a gate coupled to said drain of said second P-channel device and a drain coupled to said output node.

17. A register, comprising:
   a gate circuit, having a plurality of inputs receiving a clock signal and coupled to first and second intermediate nodes, and having first and second outputs switched in response to said plurality of inputs after a delay;

a stack circuit, having first and second inputs respectively coupled to said first and second outputs of said gate circuit, having a third input coupled to a data input, and having first and second outputs respectively coupled to said first and second intermediate nodes;

wherein said gate and stack circuits are operative to toggle said first and second intermediate nodes between an initial state when said clock signal transitions low after said delay and a data state indicative of said data input when said clock signal transitions high after said delay;

a keeper circuit that latches said data state of said first and second intermediate nodes;

an output circuit that drives an output node with valid data while said first and second intermediate nodes are in said data state; and a pupil circuit that stores said data state of said first and second intermediate nodes and that drives said output node with valid data while said clock signal is low.

18. The register of claim 17, wherein said gate circuit comprises a NAND gate and a NOR gate.

19. The register of claim 17, wherein said stack circuit comprises a plurality of N-channel and P-channel devices coupled in series between a voltage source and ground.

20. The register of claim 17, wherein said pupil circuit comprises a storage circuit that stores said data state of said first and second intermediate nodes and a second output circuit coupled to said storage circuit and said output node and receiving said clock signal.

* * * * *